(12) United States Patent
Lam et al.

(10) Patent No.: US 9,673,114 B1
(45) Date of Patent: Jun. 6, 2017

(54) PRECISION SUBSTRATE MATERIAL REMOVAL USING MINIATURE-COLUMN CHARGED PARTICLE BEAM ARRAYS

(71) Applicant: Multibeam Corporation, Santa Clara, CA (US)

(72) Inventors: David K. Lam, Saratoga, CA (US); Kevin M. Monahan, Cupertino, CA (US); Michael C. Smayling, Fremont, CA (US); Theodore A. Prescop, San Jose, CA (US)

(73) Assignee: Multibeam Corporation, Santa Clara, CA (US)

( * ) Notice: Subject to any disclaimer, the term of this patent is extended or adjusted under 35 U.S.C. 154(b) by 54 days.

(21) Appl. No.: 14/695,767

(22) Filed: Apr. 24, 2015

Related U.S. Application Data

(63) Continuation of application No. 14/694,710, filed on Apr. 23, 2015.

(60) Provisional application No. 62/115,626, filed on Feb. 12, 2015, provisional application No. 62/151,225, filed on Apr. 22, 2015, provisional application No. 62/107,332, filed on Jan. 23, 2015.

(51) Int. Cl.
| | |
|---|---|
| *H01L 21/66* | (2006.01) |
| *H01L 21/3065* | (2006.01) |
| *H01L 21/308* | (2006.01) |
| *H01L 21/26* | (2006.01) |
| *H01J 37/305* | (2006.01) |
| *H01J 37/30* | (2006.01) |

(52) U.S. Cl.
CPC .............. *H01L 22/26* (2013.01); *H01J 37/30* (2013.01); *H01J 37/305* (2013.01); *H01J 37/3053* (2013.01); *H01J 37/3056* (2013.01); *H01L 21/26* (2013.01); *H01L 21/308* (2013.01); *H01L 21/3065* (2013.01); *H01L 22/12* (2013.01); *H01L 22/20* (2013.01); *B81C 2201/0143* (2013.01); *H01J 2237/24592* (2013.01); *H01J 2237/30466* (2013.01); *H01J 2237/30472* (2013.01); *H01J 2237/3174* (2013.01); *H01J 2237/31749* (2013.01)

(58) Field of Classification Search
None
See application file for complete search history.

(56) References Cited

U.S. PATENT DOCUMENTS

| | | | | |
|---|---|---|---|---|
| 2011/0207328 | A1* | 8/2011 | Speakman | .......... H01L 51/0016 438/694 |
| 2011/0309553 | A1* | 12/2011 | Huff | ....................... B23K 17/00 264/400 |
| 2016/0093763 | A1* | 3/2016 | Rana | ................... B23K 26/0084 438/57 |

* cited by examiner

*Primary Examiner* — Jiong-Ping Lu
(74) *Attorney, Agent, or Firm* — Seth A. Horwitz

(57) ABSTRACT

Methods, devices and systems for patterning of substrates using charged particle beams without photomasks and without a resist layer. Material can be removed from a substrate, as directed by a design layout database, localized to positions targeted by multiple, matched charged particle beams. Reducing the number of process steps, and eliminating lithography steps, in localized material removal has the dual benefit of reducing manufacturing cycle time and increasing yield by lowering the probability of defect introduction. Furthermore, highly localized, precision material removal allows for controlled variation of removal rate and enables creation of 3D structures or profiles. Local gas injectors and detectors, and local photon injectors and detectors, are local to corresponding ones of the columns, and can be used to facilitate rapid, accurate, targeted substrate processing.

28 Claims, 15 Drawing Sheets

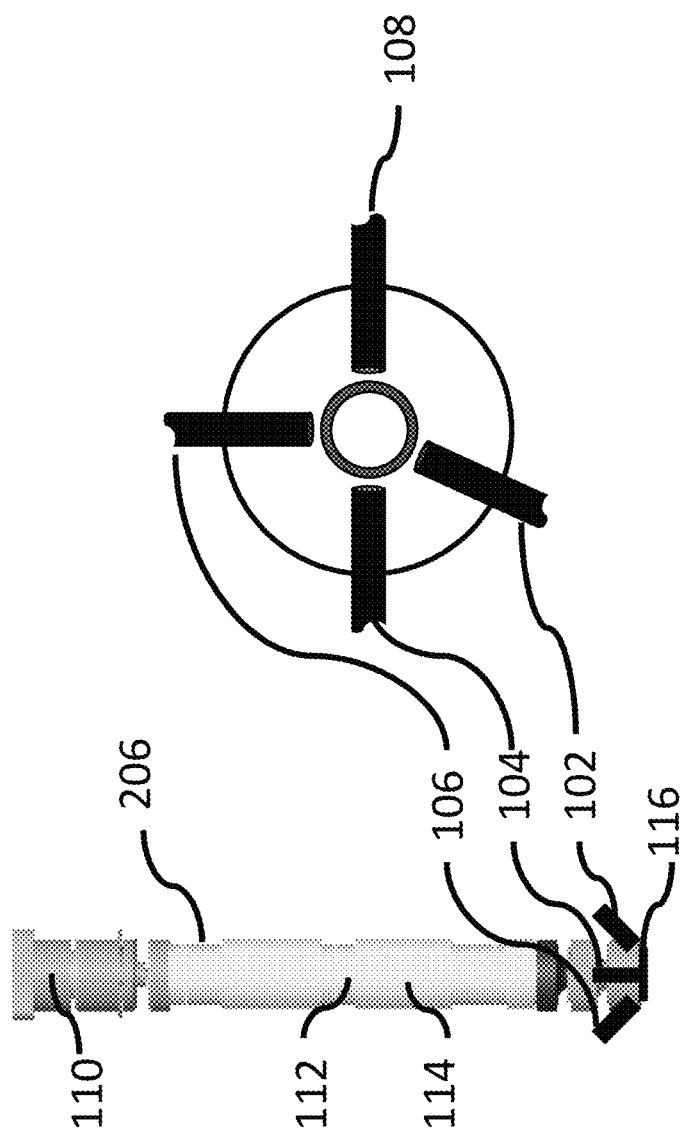

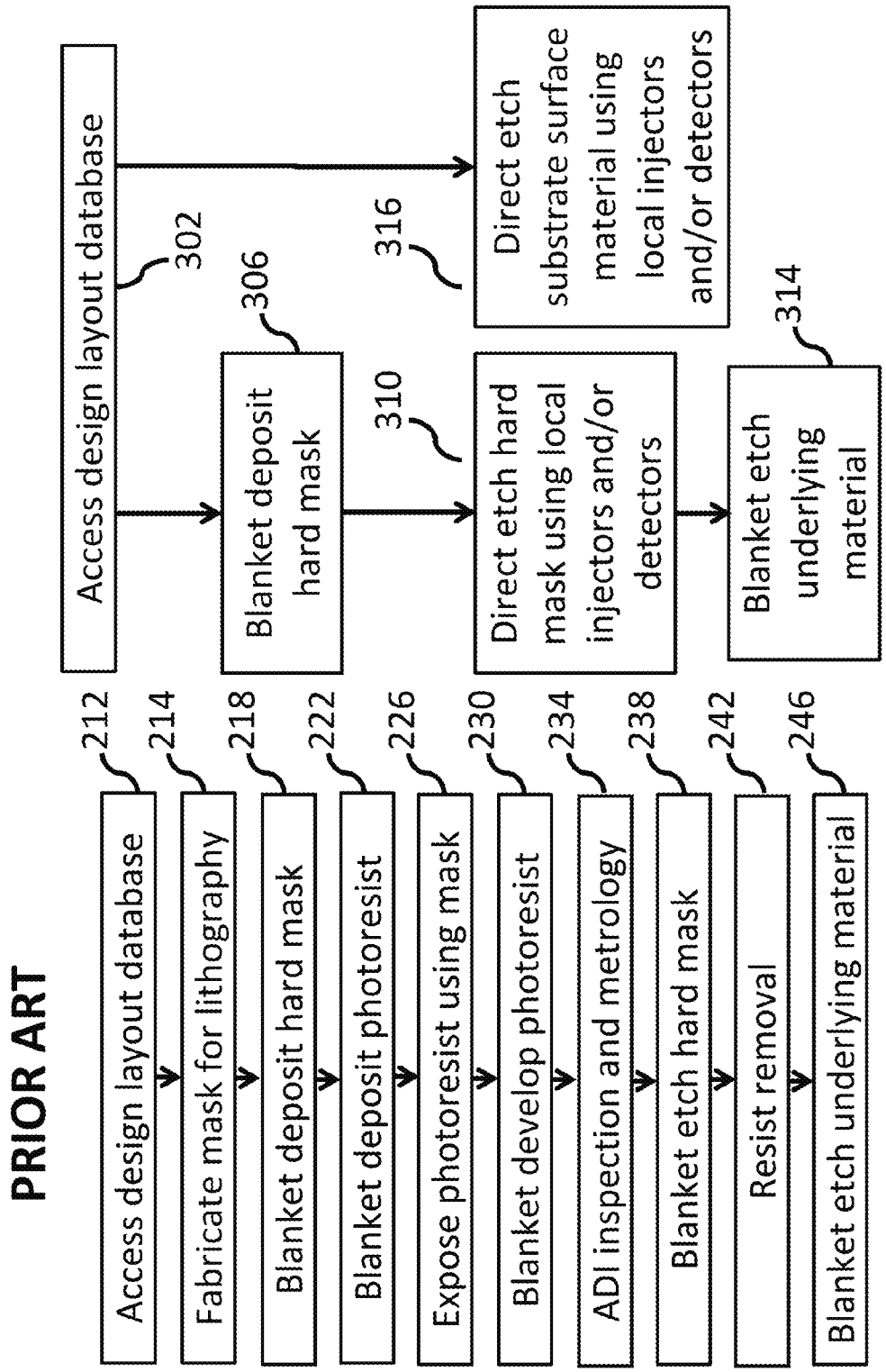
Figure 3B (PRIOR ART) / Figure 3C

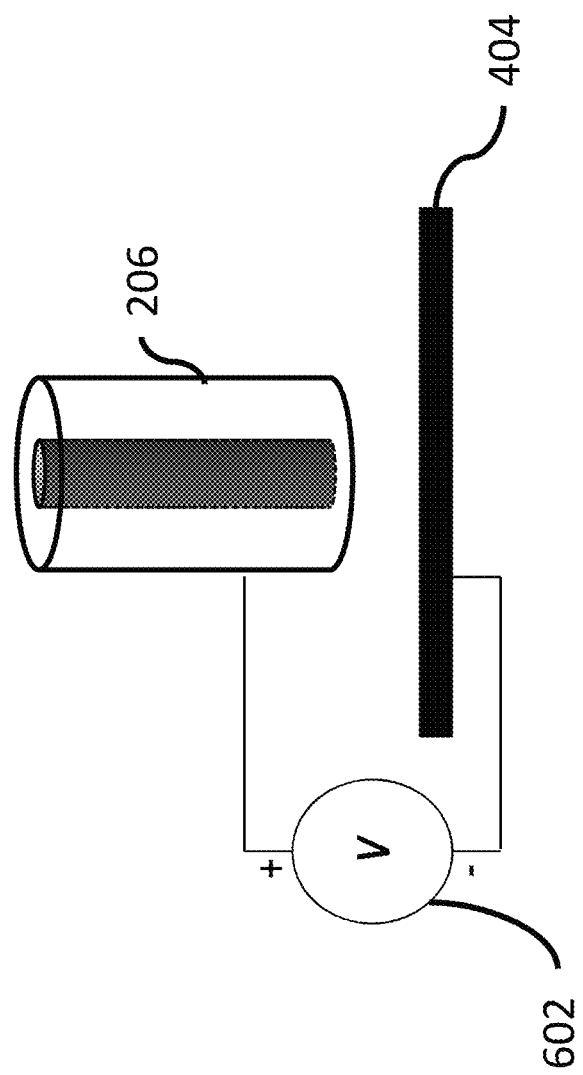

PRECISION SUBSTRATE MATERIAL REMOVAL USING MINIATURE-COLUMN CHARGED PARTICLE BEAM ARRAYS

CROSS-REFERENCE

Priority is claimed from, and this application is a non-provisional of, Provisional Pat. App. No. 62/107,332, filed Jan. 23, 2015; Provisional Pat. App. No. 62/115,626, filed Feb. 12, 2015; and Provisional Pat. App. No. 62/151,225, filed Apr. 22, 2015, which are hereby incorporated by reference.

BACKGROUND

The present application relates to systems, devices and methods for maskless material removal from substrates using charged particle beams; and more particularly to directly removing material from precise locations as defined in a design layout database using multiple, matched charged particle beams, with the assistance of gas and/or photon injection, and/or of gas and/or photon process control, metrology and endpoint detection.

Note that the points discussed below may reflect the hindsight gained from the disclosed inventions, and are not necessarily admitted to be prior art.

FIG. 2A shows an example of a wafer 200 being scanned by multiple charged particle beams 204 emitted by respective miniature electrostatically-deflected beam columns 206. Individual columns 206 are able to target a portion 202 of the substrate surface with their respectively emitted beams 204.

FIG. 2B shows an example of a wafer 200. Example die 208 size and column 206 center-to-center spacing 210 (column separation) are shown. A regular grid of columns 206 (columns 206 are shown via their center positions, represented here as plusses) can use different spacing 210 in different (generally, orthogonal) directions. Die 208 size and column separation 210 are not required to (and generally, will not) correspond. Column separation 210 generally corresponds to the "writing area" of corresponding columns 206. A column's 206 "writing area" is defined as the substrate area 202 targetable by a charged particle beam 204 emitted from the column 206, taking into account stage movement.

The multiple column 206 array comprises miniature (small enough to fit multiple columns in an array) charged particle beam columns 206 arranged in a regular grid. For example, column 206 arrays with center-to-center column spacing 210 of 30 mm×30 mm have been implemented, though other column spacings 210 (e.g., 24 mm×33 mm) can also be used.

A stripe is the portion of the wafer 200 surface that a charged particle beam can target while the stage is moving predominantly in a single direction, i.e., before the stage moves laterally and switches predominant directions to give the beam access to a different stripe. A "frame" is defined herein as the portion of the wafer surface that a beam can target at a given time, corresponding to the main-field deflection area at that time, as designated by the design layout database. A frame is typically designated to be rectangular, for convenience (e.g., to tile the writing area); and smaller than the furthest extent to which the beam can be deflected (e.g., to preserve beam targeting accuracy).

"1-D" refers to 1-D gridded design rule. In a 1-D layout, optical pattern design is restricted to lines running in a single direction, with features perpendicular to the 1-D optical design formed in a complementary lithography step known as "cutting". The complementary step can be performed using a charged particle beam lithography tool comprising an array of columns 206—for example, electrostatically-controlled miniature electron beam columns 206. A 1-D layout is separated in the design layout database into a "line pattern" and a "cut pattern". The design layout database contains the information needed by lithography tools to pattern one or more layers on a substrate. A line pattern generally comprises an array of unidirectional lines. Cut patterns generally comprise line-cuts and holes.

Generally, line patterns are written by an optical lithography system, which can be followed by other process steps to increase the density of lines on the substrate. Cut patterns are written by a complementary (generally higher-resolution) process, such as electron beam lithography. Use of electron beam lithography for this complementary process is also called complementary e-beam lithography, or CEBL. The combination of the line-forming process followed by line-cuts written with CEBL to pattern a substrate layer is called complementary lithography.

FIG. 2C shows an example of a prior art process for removing material from a substrate surface.

Typically, as shown in FIG. 2C, a design layout database is used to designate where substrate surface material should be removed 212 (e.g., to form new pattern or repair previously-formed pattern). One or more optical masks are fabricated based on the design layout database 214 using a mask making tool 216. Fabrication of an optical mask typically takes weeks and costs millions of dollars at advanced process nodes.

A hard mask is blanket deposited on the substrate surface 218 by a deposition tool 220, and a photoresist layer is blanket deposited on the substrate surface 222 by a resist deposition tool 224.

"Blanket" deposition and etch generally refers to deposition and etch on the entire surface of the substrate.

"Resist" refers herein to a class of materials used in substrate lithography. When a resist is deposited on a substrate and exposed to an energy source corresponding to the type of resist (e.g., photons for a photoresist) in a chosen pattern, its chemical properties change such that when the resist is developed (in ways similar to developing a photographic film), a portion of the resist corresponding to a positive or negative image of the pattern (depending on the type of resist) will remain, allowing the pattern to be expressed in the material underlying the resist, e.g., using etch steps.

The photoresist is then exposed using the optical mask(s) 226 by an optical lithography tool 228. The exposed portion of the substrate (as designated by the optical mask(s)) is removed 230 using a resist developing tool 232, and the resulting patterned resist layer is inspected for defects and process control metrology (After Develop Inspection (ADI) and metrology) 234 by an inspection tool 236. Yield-reducing errors can be reduced by other tools, adding additional steps, and potentially additional defects.

The hard mask is then blanket etched through the pattern expressed in the resist layer 238, by an etch tool 240, to express (substantially) the same pattern in the hard mask layer. The resist layer is then removed 242 by a resist removal tool 244, and the material underlying the hard mask is blanket etched through the pattern expressed in the hard mask 246, using an etch tool 248 (e.g., a reactive-ion etch or ion milling tool, generally the same type of tool as etch tool 240), to express (substantially) the same pattern in the underlying material. One of ordinary skill in the arts of charged particle beam material removal will understand that other and/or additional steps can be used in a conventional material removal process.

$T_i$ represents the amount of time added by a corresponding process step. $Y_i$ represents the yield impact of a corresponding process step (one minus probability of introducing one or more yield-reducing defects). Where T is the total time taken by a material removal process, and Y is the expected yield following a material removal process:

$$T = \sum_{i=1}^{N} T_i \qquad \text{Equation 1}$$

$$Y = \prod_{i=1}^{N} Y_i \qquad \text{Equation 2}$$

Numerous steps in conventional semiconductor lithography material removal processes are expensive and time consuming, and potentially introduce defects into the desired pattern, lowering yield. Process-induced defects can be introduced by, for example, wafer handling, resist spin and heating, lithography, resist development, etch, deposition, inspection, implantation, thermal processing, and chemical-mechanical polishing.

SUMMARY

The present application discloses new approaches to systems, devices and methods for precision removal of material from a substrate using multiple miniature charged particle columns configured to directly etch hard mask, substrate pattern layer and other materials WITHOUT A RESIST LAYER.

In particular, the inventors have discovered that etching and milling using charged particle beam columns can be accelerated by multiple orders of magnitude by using local injectors fixedly located with respect to corresponding ones of the columns, and proximate, oriented towards and having line of sight to corresponding ones of the frames.

Innovatively, local photon injectors can be used to precisely heat the locations targeted by the charged particle beams, to thereby tune the adsorption rate of the targeted material; to shine photons with a chemistry-characteristic wavelength on the locations targeted by the charged particle beams to tune reaction rate and/or efficiency; and to provide photons reflected or emitted from the substrate surface to local photon detectors for analysis.

Further innovatively, local gas injectors connected to kinetic lenses (collimating or redirecting gas particles towards the frame) can be used to raise partial pressure of process-critical gasses (e.g., oxidizing or reducing gasses) by orders of magnitude over the average ambient pressure in the vacuum chamber to increase reaction rate.

The inventors have also discovered that local photon detectors and gas detectors, situated locally to and collecting data directly from beam target locations, can be used to monitor and provide feedback to control of charged particle beam columns performing material subtraction processes, including for example process endpoint detection. Local gas detectors can use kinetic lenses to increase specificity and quantity of collected gasses.

Preferred embodiments of miniature column charged particle beam material subtraction include material removal (e.g., etching/milling), control and inspection processes that can work directly and automatically from the SAME design layout database. In some embodiments, these and other processes can be implemented together within a single modular tool, allowing patterning of entire layers without breaking vacuum.

Material subtraction processes can be used to replace conventional resist-pattern-develop-etch lithography processes for some or all substrate layers to eliminate numerous lithography steps, increase throughput and dramatically increase yield.

BRIEF DESCRIPTION OF THE DRAWINGS

The disclosed inventions will be described with reference to the accompanying drawings, which show important sample embodiments and which are incorporated in the specification hereof by reference, wherein:

FIG. 1 schematically shows an example of a charged particle beam column.

FIG. 3B shows an example of a prior art substrate material removal process.

FIG. 3C shows an example of a direct material subtraction process.

FIG. 6 schematically shows an example of a voltage bias applied between a charged particle beam column and a substrate.

DETAILED DESCRIPTION OF SAMPLE EMBODIMENTS

Figure 2A:
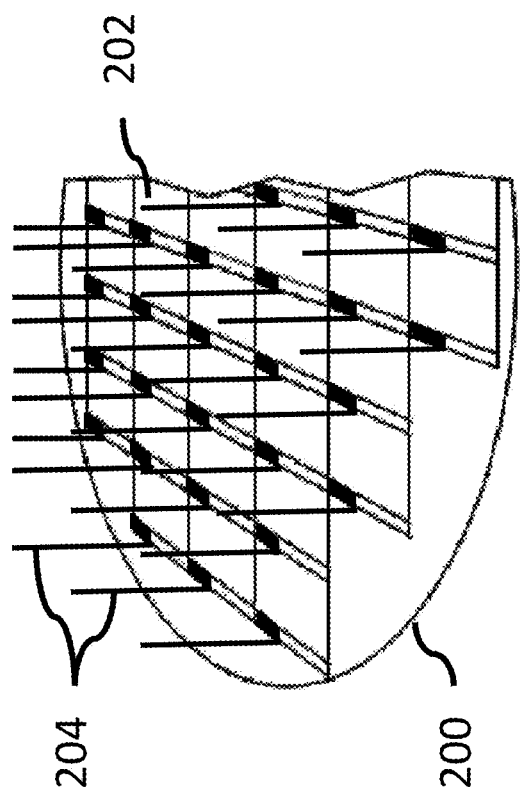
FIG. 2A shows an example of a wafer being scanned by multiple charged particle beams emitted by respective beam columns.
Figure 2B:
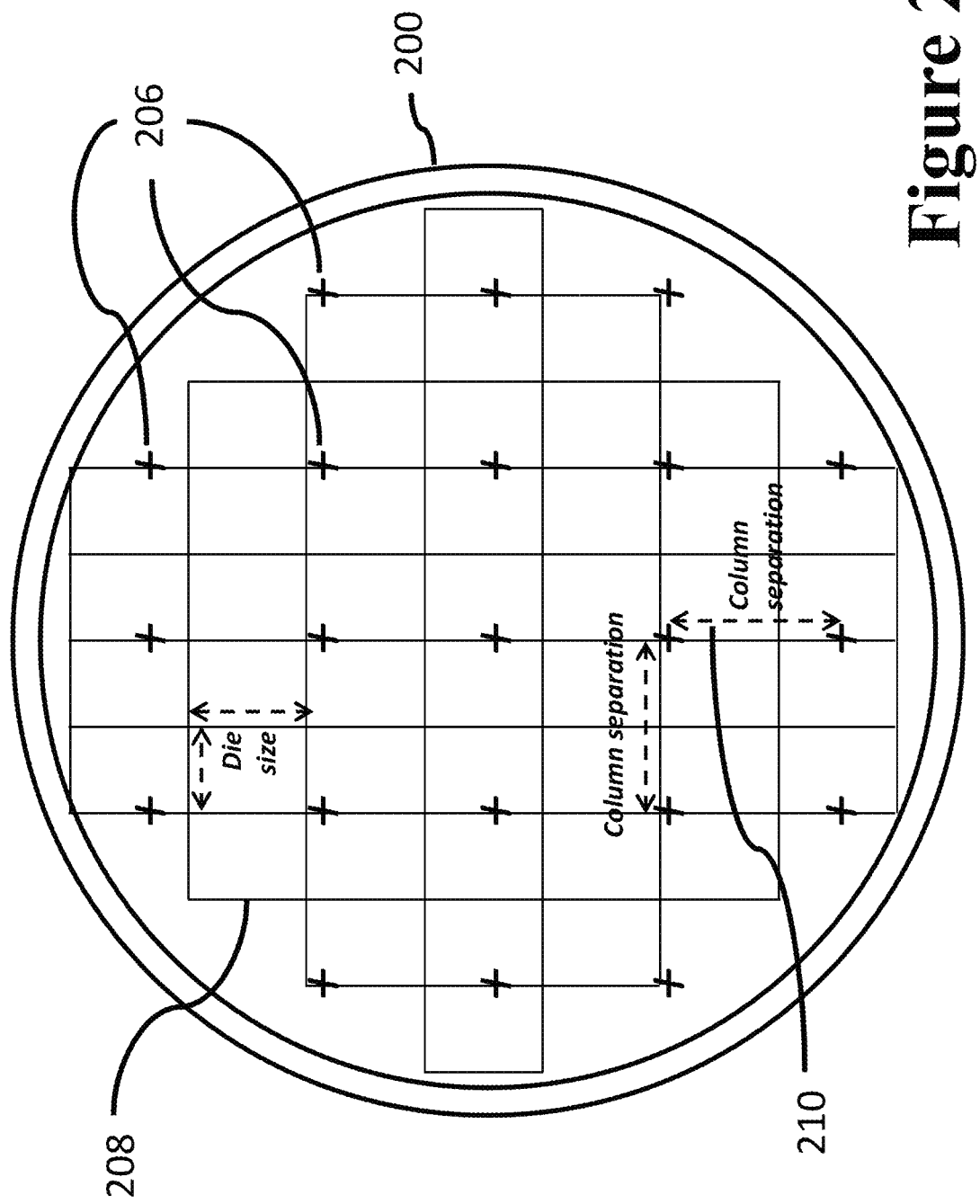
FIG. 2B shows an example of a wafer.

The numerous innovative teachings of the present application will be described with particular reference to presently preferred embodiments (by way of example, and not of limitation). The present application describes several inventions, and none of the statements below should be taken as limiting the claims generally.

The present application discloses new approaches to systems, devices and methods for precision removal of material from a substrate 404 using multiple miniature charged particle columns 206 configured to perform material subtraction directly on hard mask, substrate pattern layer and other materials WITHOUT A RESIST LAYER.

In particular, the inventors have discovered that material removal (e.g., etching and/or milling) using charged particle beam columns 206 can be accelerated by multiple orders of magnitude by using local injectors 102, 104 fixedly located with respect to corresponding ones of the columns 206, and proximate, oriented towards and having line of sight to corresponding ones of the frames 410.

Innovatively, local photon injectors 104 can be used to precisely heat the locations on the substrate 404 targeted by the charged particle beams, to thereby tune the adsorption rate of the targeted material; to shine photons with a chemistry-characteristic wavelength on the locations targeted by the charged particle beams 204 to tune reaction rate and/or efficiency; and to provide photons reflected or emitted from the substrate surface to local photon detectors 108 for analysis.

Further innovatively, local gas injectors 102 connected to kinetic lenses 402 (collimating or redirecting gas particles towards the frame 410) can be used to raise partial pressure of process-critical gasses (e.g., oxidizing or reducing gasses) by orders of magnitude over the average ambient pressure in the vacuum chamber to increase reaction rate.

The inventors have also discovered that local photon detectors 108 and gas detectors 106, situated locally to and collecting data directly from beam target locations, can be used to monitor and provide feedback to control of charged particle beam columns 206 performing material subtraction processes, including for example process endpoint detection. Local gas detectors 106 can use kinetic lenses 402 to increase specificity and quantity of collected gasses.

Preferred embodiments of miniature column charged particle beam material subtraction include material removal, control and inspection processes that can work directly and automatically from the SAME design layout database. In some embodiments, these and other processes can be implemented together within a single modular tool, allowing patterning of entire layers without breaking vacuum.

Material subtraction processes can be used to replace conventional resist-pattern-develop-etch lithography processes for some or all substrate layers to eliminate numerous lithography steps, increase throughput and dramatically increase yield.

The disclosed innovations, in various embodiments, provide one or more of at least the following advantages. However, not all of these advantages result from every one of the innovations disclosed, and this list of advantages does not limit the various claimed inventions.

Enables rapidly writing a pattern layer WITHOUT RESIST;
enables rapidly writing a pattern layer WITHOUT PHOTOMASKS;
improves yield;
faster manufacturing of semiconductor and other substrate devices;
lower cost manufacturing of semiconductor and other substrate devices;
faster design to manufacturing process;
lower cost design to manufacturing process;
faster per-layer patterning cycle;
lower cost per-layer patterning cycle;
lower tool cost to pattern a substrate layer;
fewer tools required to pattern a substrate layer;
decreased chemical usage of reactive material removal processes;
decreased environmental impact of reactive material removal processes;
enables layer patterning, pattern inspection, defect identification and pattern repair without breaking vacuum;
material removal is LOCALIZED to material affected by charged particle beams; and
fewer stage transfers when patterning a substrate layer.

Some exemplary parameters will be given to illustrate the relations between these and other parameters. However it will be understood by a person of ordinary skill in the art that these values are merely illustrative, and will be modified by scaling of further device generations, and will be further modified to adapt to different materials or architectures if used.

"Substrate" is defined herein as a workpiece having a composition and shape amenable to patterning and deposition of one or more layers of material thereupon using techniques applicable to semiconductor device fabrication, such that functional devices can be produced therefrom.

"Material subtraction" is defined herein as removal of material from a substrate's surface using one or more electrostatically-deflected charged particle beams; said removal localized to material directly affected by said beams, and comprising at least some intended (not incidental) removal of material immediately following said direct affect by said beams. Removed material can comprise, for example, pure and/or doped substrate material, or material previously added onto or embedded into the substrate's surface.

The present application is directed to, for example, factory-integrated use of systems comprising multiple miniature charged particle beam columns 206 to create nanometer-scale patterns on semiconductor wafers 200 or other substrates. Arrays of miniature, non-magnetic, electrostatically-controlled columns 206 can be used to pattern wafers 200 and other substrates directly, without masks, without resist, and without previous lithographic steps. Such systems can be used to achieve massively parallel substrate processing and to reduce stage travel per layer (or other cycle measure) of processing.

Embodiments disclosed herein enable precision processing of materials and, in particular, targeted subtraction of materials common in the processing of semiconductor wafers 200 and other electrically, magnetically, optically, mechanically, chemically, or biologically active substrates. Such substrates can comprise, for example, workpieces used in fabrication and repair of light emitting diodes (LEDs), giant magnetic resonance (GMR) structures used in thin-film heads, opto-electronic devices (OEDs) used for switching, micro-electro-mechanical systems (MEMS) structures, photonic metamaterials, and patterned substrates used for chemical analysis and genetic sequencing.

Material subtraction can be performed using one or more multi-column charged particle beam systems using reactive ion etching, reactive and/or non-reactive ion milling, or electron-assisted (reactive) etching of semiconductor wafers 200 and other substrates. Material subtraction processes can be performed either sequentially or simultaneously by multiple columns 206 in an array 802, and different columns 206 in an array 802 can be configured and/or optimized to perform the same material subtraction (or other) process, or different material subtraction processes (or other processes, e.g., inspection and metrology).

Material subtraction can create a layer of pattern specified by the design layout database in its entirety or in a complementary fashion with other patterning processes. For example, material subtraction can be used to form cut features in 1-D lines produced by optical lithography (similar in design principle to complementary lithography, but without using a resist layer during the charged particle beam phase, and without many of the steps required when using a resist layer, as further explained below).

In preferred embodiments, the array 802 of charged particle beam columns 206 is stationary, the stage holding the wafer 200 moves back and forth, and individual charged particle beam columns 206 move the corresponding beam 204 across the wafer 200 to perform material subtraction.

Preferably, beam motion across the wafer 200 (or other substrate) comprises vector scanning to a target feature or "care-area" containing a target feature, and raster scanning across the target feature while writing or inspecting. Preferably, each column 206 has its own local (short communication path) control computer. Vector-raster scanning, care-areas, and use of multiple control computers local to respective columns 206 are disclosed in U.S. patent application Ser. No. 14/085,768, which is incorporated herein by reference. These control methodologies enable areas of interest to be irradiated, while efficiently avoiding areas where material subtraction (or other charged particle beam function) is not required.

Rapid pattern alignment and registration with superior accuracy (e.g., for minimizing pattern overlay error) can be achieved using imaging targets generated using Hadamard and/or Walsh functions as disclosed in, for example, Ser. No. 14/522,563, which is incorporated herein by reference.

High beam current can be maintained by minimizing charged-particle crossovers in the columns 206, reducing current-limiting Coulomb effects.

The design layout database is preferably partitioned to designate which column 206 will perform the work for the corresponding substrate writing area. Preferably, writing areas have the same size as column-to-column spacing 210.

In preferred embodiments, different columns 206 can perform material subtraction (and/or other processes, such as imaging, depending on configuration) on a patterned or unpatterned substrate differently and independently, with beam deflection parameters determining targeted beam landing position based directly (though generally not only; e.g., tool parameter settings are also typically used, and identified areas of interest can be considered, as mentioned above) on a previously-partitioned design layout database used by various column functions (e.g., both material subtraction and inspection functions). Use of multiple columns 206 to independently and simultaneously write and/or image a substrate, both based directly on the same previously-partitioned design layout database, is disclosed in, for example, U.S. Pat. No. 8,999,627, which is incorporated herein by reference. As used herein, "matched" columns 206 means that columns 206 are "substantially the same", and stages are "substantially the same", as "substantially the same" is defined in U.S. Pat. No. 8,999,627. Generally, different matched columns 206 are able to process corresponding different writing areas of a substrate similarly (preferably, nearly identically).

Beam targeting based directly on a design layout database includes, for example, not using a KLA results file (or similar file created by a tool not using multiple electrostatically-deflected charged particle beam columns 206).

Columns 206 can be configured such that different columns 206 use different physical and chemical processes for highly localized removal. Etch parameters can be independently and automatically optimized per-column based on automatically analyzed images taken of etch results. Automatic image analysis and etch parameter optimization are disclosed in, for example, U.S. Pat. No. 8,999,628, which is incorporated herein by reference.

One of ordinary skill in the arts of charged particle beam material removal will recognize that a wide variety of other control options are available per-column 206.

Preferably, photon injectors 104 and detectors 108, and gas injectors 102 and detectors 106, as described below are "miniature"; that is, they are small enough to position (preferably, fixedly) at or near the bottom of a column 206 (preferably, attach to the column 206) whichever of said injectors and detectors 102, 104, 106, 108 are required by the embodiment, such that the injector or detector 102, 104, 106, 108 (and particularly the corresponding emitter or collector portion thereof) is located to permit function as described herein.

FIG. 1 schematically shows an example of a charged particle beam column 206 configured for material subtraction. Preferably, an array 802 of such columns 206 is used to perform material subtraction (as disclosed with respect to, e.g., FIGS. 3A and 8).

As used herein with respect to a gas or photon injector or detector 102, 104, 106, 108, "local" (also "Local" and "LOCAL") is defined as: mounted in a fixed position with respect to a corresponding one of multiple columns 206, the active emitting or collecting component(s) of said injector or detector 102, 104, 106, 108 having line of sight to and oriented towards the main-field deflection area 410, said active component(s) at least partially contained within the perimeter of the column 206. An active emitting or collecting component(s) is the optical lens, gas inflow or outflow opening, or kinetic lens 402 that for the respective local injector or detector 102, 104, 106, 108 last emits gas particles or photons towards, or first collects gas particles or photons from, the corresponding main-field deflection area 410. Preferably, said active component(s) is as close as practical to the center of the column's 206 primary axis and to the substrate surface 406 without impacting the substrate surface 406, and without compromising column function (e.g., electrical characteristics of the column 206) or the focus area of the active component(s). Greater proximity is preferred, for example, to preserve collimation or focus, and for gas and photon collection effectiveness, selectivity and efficiency.

Except where stated otherwise, gas and photon injectors 102, 104 and detectors 106, 108 described with respect to the various embodiments disclosed herein are local. Material subtraction using multiple miniature charged particle beam columns 206 is enabled by the use of LOCAL gas and/or photon injectors and/or detectors 102, 104, 106, 108 as disclosed herein.

Local gas injectors 102 and/or local photon injectors 104 can be used to greatly increase material removal rates of charged particle beam etching and/or milling; in some embodiments, sufficiently to provide throughput compatible with in-line fabrication processes. Further, as discussed below with respect to FIGS. 3A and 3B, preferred embodiments provide significant yield advantages.

Local gas and photon detectors 106, 108 enable real time detection of spatially localized process endpoints: generally, localized per-column 206 to individual frames 410. Features can be etched or milled to the correct depth, neither deeper nor shallower than desired. Further, thin holes can be etched and/or milled to the same (or different) depth as a wide hole; or deep thin holes and shallow wide holes, or vice versa, or a combination thereof, can be etched and/or milled.

As shown in FIG. 1, a general-purpose embodiment of a charged particle beam column 206 configured for material subtraction comprises: a charged particle beam gun 110 (an ion gun or electron beam gun, respectively), including a charged particle source (an ion or electron source, respectively), aperture and electrostatic lens; a deflection assembly 112 for blanking the charged particle beam 204, deflecting the charged particle beam trajectory, and/or modifying the charged particle beam shape (blanking, deflecting or reshaping the ion or electron beam 204, respectively); a main lens 114, for focusing the charged particle beam (ion or electron beam 204) or adjusting the beam size at the substrate plane; one or more local gas injectors 102, for creating oxidizing or reducing environments for reactive ion etching, reactive ion milling or electron-assisted etching, or for creating other or additional advantageous chemical environments within the main-field deflection area 410; one or more local photon injectors 104; a local gas detector 106; one or more local photon detectors 108; and an electron detector 116, e.g., to detect secondary electrons for endpoint detection, and/or for overlay and localized process monitoring.

A local gas injector 102 can be used to increase the partial pressure of reactants and other gas particles within a main-field deflection area 410 significantly (e.g., by multiple orders of magnitude) relative to the average ambient pressure in the vacuum chamber, while having minimal effect on reactant concentration at other main-field deflection areas 410 (corresponding to other columns 206). A kinetic lens 402 (further described below with respect to, e.g., FIGS. 4A, 4B, 4C, 4D and 4E) connected to a local gas injector 102 to collimate or focus the gas injector's 102 output on an area of the substrate surface containing the main-field deflection area 410 of a corresponding column 206 further significantly raises consistently achievable partial pressures (in some embodiments, by multiple orders of magnitude). These large increases in partial pressures of advantageous gasses in a main-field deflection area 410—and thus, at the corresponding charged particle beam impact location—can raise the material removal rate of the material subtraction process by multiple orders of magnitude.

Generally, gas flow rate can be calculated ahead of time and depends on several parameters, including the particular process to be used (and its required and/or desired chemistry), local temperature (which can be controlled to be substantially constant, within an acceptable range depending on the particular process), the design layout database, and charged particle beam current (which can be constant). If necessary, modifications to gas flow parameters during a material removal process can be made based on feedback from local detectors.

In a preferred embodiment, gas flow rate is kept above a pre-determined threshold such that supply of gas reactants is not limiting.

A local photon injector 104 is preferably a light source optically connected by an optical fiber to a lens. Local photon injectors 104 emitting infrared (IR) photons can be used to precisely raise the temperature of the substrate at the beam impact location to optimize temperature conditions for the corresponding charged particle beam etching or milling process, without overheating the substrate as a whole. Preferably, the lens focuses the IR photons on a minimal area containing the main-field deflection area 410. In reactive embodiments (e.g., reactive etching), temperature optimization can be used to increase substrate surface material adsorption rate of reactive gasses (higher reactive gas adsorption rate generally correlates to higher material subtraction rate). In non-reactive embodiments, temperature changes can also affect material subtraction rate. Using temperature measured within a known small area containing the beam impact location (e.g., a minimal area containing the main-field deflection area 410), preferably using a local photon detector 108, temperature at the beam impact location can be approximated. By optimizing said temperature conditions, the material removal rate of the material subtraction process can be significantly increased.

Desired local temperatures for individual columns 206 can be determined prior to starting a material removal process, depending on, for example, the design layout database and characteristics of the particular reactive or nonreactive process(es) to be used. Feedback from local temperature measurement can then be used to control brightness and other characteristics (e.g., pulse rate, pulse duration) of the photon injector 102 to precisely control the local temperature of the substrate.

Figure 5:
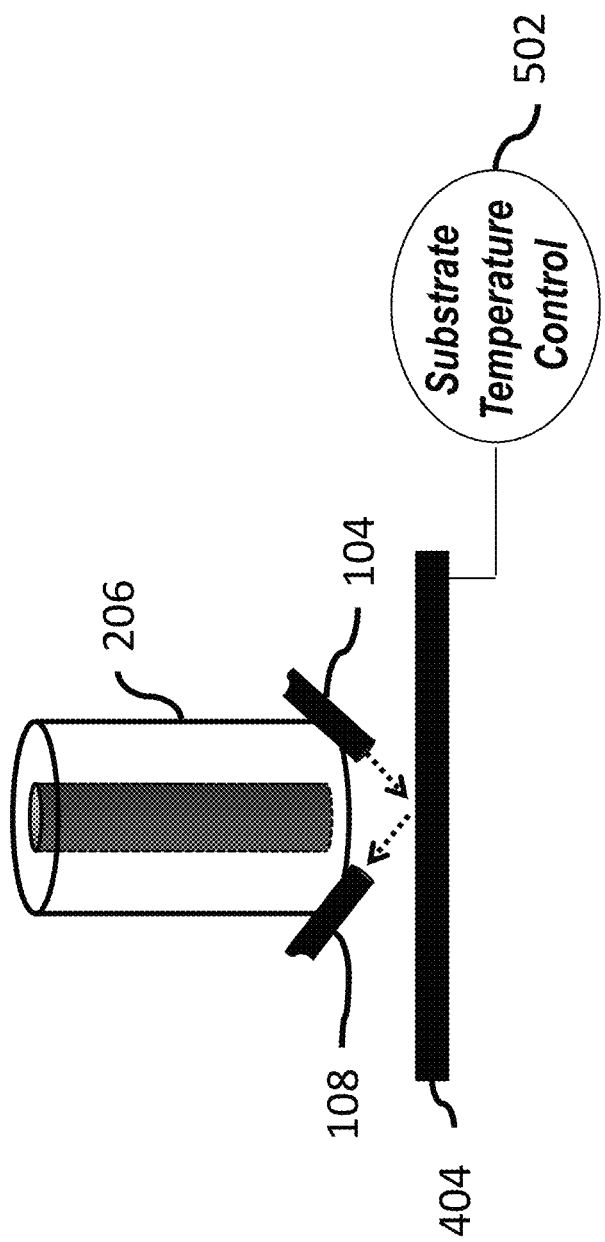
FIG. 5 schematically shows an example of a photon injector and a photon detector mounted on a charged particle beam column.

Local photon injectors 104 can also be used to shine photons, with wavelength(s) appropriate to one or more substrate surface materials, on the main-field deflection area 410 to further accelerate certain types of material subtraction by exciting substrate surface material electrons to a higher energy state. For example, deep UV is characteristic for photochemistry of various materials Local photon injectors 104 can also be used to shine photons on the substrate surface material to perform various analyses (process monitoring) of substrate surface material, e.g., polarimetry, reflectometry and/or interferometry. For example, the intensity of reflected injected photons depends on the thickness of the layer (the film) and its optical absorption properties. Preferably, a local photon detector 108 is arranged to collect as many of the reflected photons as possible to optimize the efficacy of such analyses, as shown in FIG. 5. Such photons can generally be of any wavelength, within limits set by available optics.

Endpoint detection refers herein to using detectors to determine when a material subtraction (e.g., etching or milling) process has been completed for a particular frame 410 (e.g., when a desired etch/mill depth has been reached). As an ongoing material subtraction process reaches layer (or other) boundaries on the substrate surface, different materials (or different quantities or proportions of materials) are removed from the substrate surface 406, and different materials (or different quantities or proportions of materials) are exposed on the substrate surface 406. As a result, both substrate surface material(s), and material(s) removed from the substrate surface 406, will show measurably changing properties at or near layer (or other) boundaries. Substrate surface material properties, and rates of change and higher-order derivatives of indicated properties, can be used to accurately determine and/or predict process endpoints.

Different embodiments can use different methods (gas, photon or electron detection, with analysis) of endpoint detection. Depending on the process, some methods of endpoint detection can be more sensitive than others. In some embodiments, use of multiple methods of endpoint detection improves endpoint detection accuracy.

Process monitoring refers herein to analysis of detected material properties to determine process accuracy and/or produce process performance metrics. Process monitoring can be used to provide process feedback (e.g., to local control computers) that enables process adjustments (e.g., etch, mill or beam parameter adjustments, or automatic design layout database modification). Process feedback can occur during, and/or resulting process adjustments can be made for, the frame 410 in which corresponding photons or gas particles were collected, or one or more subsequent frames 410, or one or more subsequent processing cycles (e.g., for a subsequent layer, or for a subsequent substrate).

Local gas detectors 106, using secondary ion mass spectrometry, can be used for process monitoring. For example, process monitoring by local gas detectors 106 can include determination of process endpoints for prior frames 410, monitoring of material removal rate, and/or analysis of removed material composition. The intensity of the most significant peaks from the mass spectra can be plotted against time in trend analysis, giving material removal depth information.

Local photon detectors 108 can be used to detect photons reflected or emitted from the substrate surface 404 near the beam impact location. Detected photons can be used to perform, for example, polarimetry, reflectometry, interferometry, or optical emission spectroscopy on substrate surface material. Substrate surface material properties indicated by such measurements generally include polarization, reflectivity, optical interference, temperature and material composition. Substrate surface material properties, and rates of change and higher-order derivatives of indicated properties, can be used to determine process endpoints, to monitor the temperature at (or in the vicinity of) the corresponding charged particle beam target impact location, to determine material removal rate, and for other process monitoring analyses.

Different columns 206 can be configured and/or optimized to perform different (or multiple) types of material subtraction or other material processing, e.g., some columns 206 can be configured to perform material subtraction, while other columns 206 are configured to perform imaging (e.g., for alignment, registration and/or wafer inspection). The wide range of per-column 206 configurability disclosed herein means that beam columns 206 can be adapted to and optimized for a wide variety of substrate processing applications.

Figure 3A:
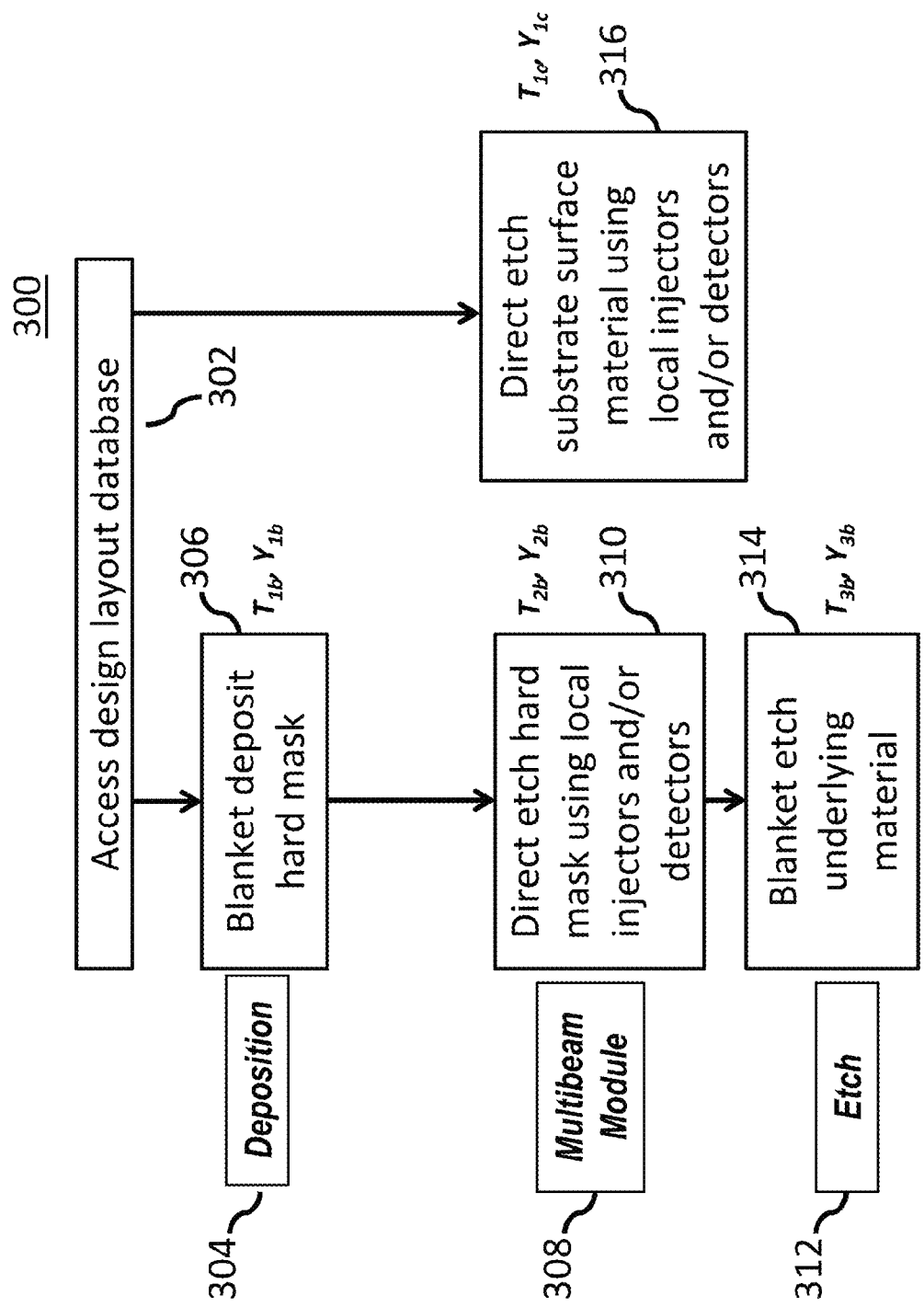
FIG. 3A shows an example of a direct material subtraction process.

FIG. 3A shows an example of a direct material subtraction process 300, with or without a hard mask, and WITHOUT A RESIST LAYER. A design layout database is used to designate where and how substrate surface material will be removed 302. In embodiments in which a hard mask will be used, a deposition tool 304 (which can be the same tool or type of tool as deposition tool 220) is used to blanket deposit a hard mask 306 on the substrate 404. A multibeam module 308 is then used to perform material subtraction on (e.g., etch and/or mill) the hard mask, using local gas and/or photon injectors 102, 104, and/or local gas and/or photon detectors 106, 108 in step 310. Having created the design layout database-designated pattern in the hard mask, an etch tool 312 (which can be the same tool or type of tool as etch tool 240 and/or 248) is used to blanket etch the substrate surface material underlying the hard mask to express the pattern in the underlying material 314.

Alternatively, when not using a hard mask, after accessing the design layout database 302, the multibeam module 308 can be used to perform material subtraction directly on substrate surface material using local gas and/or photon injectors, and/or local gas and/or photon detectors 316.

Figure 2C:
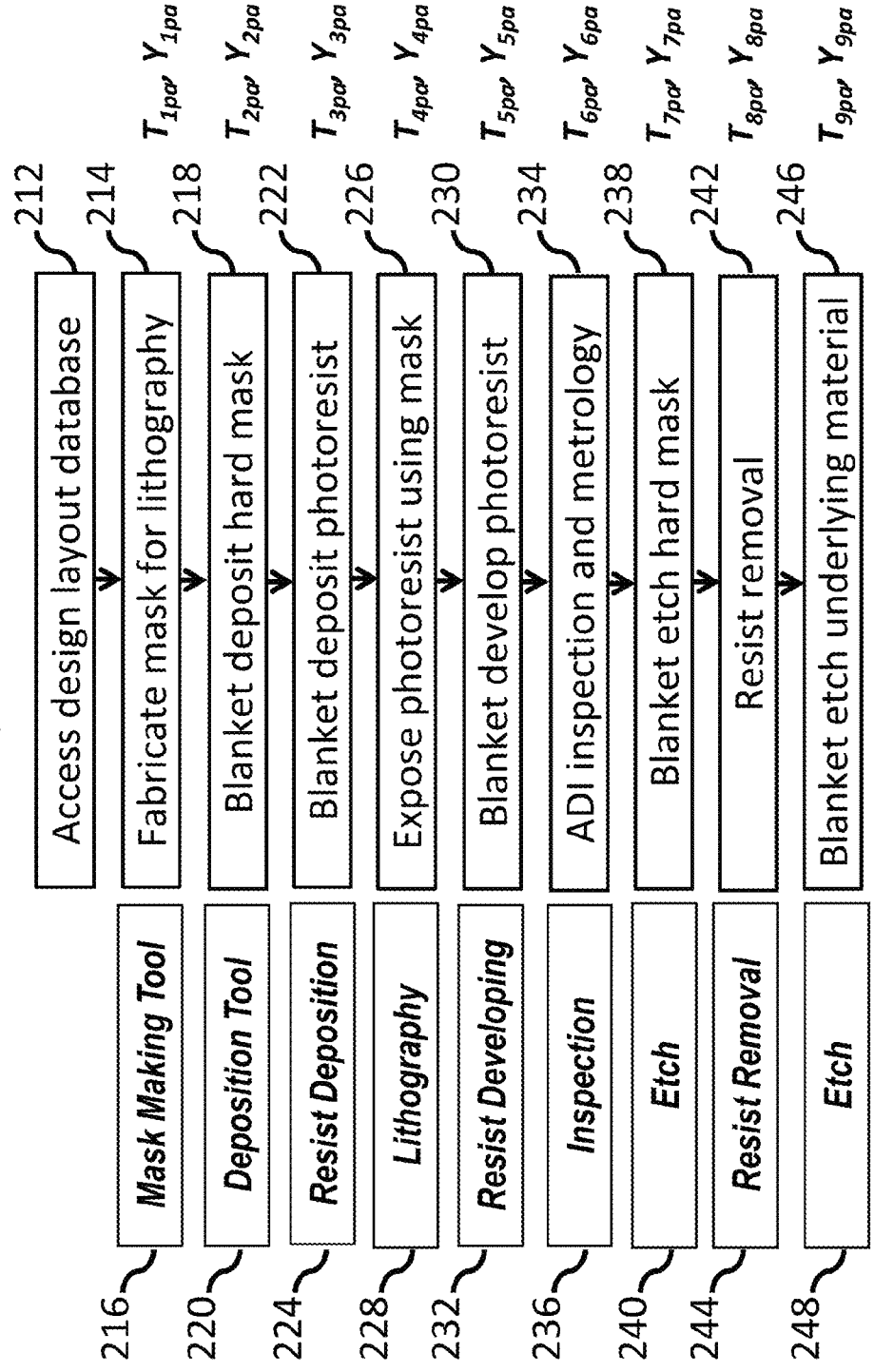
FIG. 2C shows an example of a prior art process for removing material from a substrate surface.

The material subtraction process embodiment(s) shown in FIG. 3A drastically reduces the number of steps required for precise substrate material removal—and, concomitantly, removes a wide variety of collateral sources of process-induced error, such as a large number of stage transitions—with respect to the prior art process embodiment(s) shown in FIG. 2C. See Equations 1 and 2. Consequently, manufacturing cycle time can be reduced and device yield can be increased using material subtraction with local injectors and detectors 102, 104, 106, 108 as disclosed herein.

FIG. 3B shows an example of a prior art substrate material removal process (see FIG. 2C). FIG. 3C shows an example of a material subtraction process (see FIG. 3A).

Comparison between the prior art embodiment(s) of FIG. 3B and the innovative embodiment(s) of FIG. 3C helps to clarify the drastic process simplification, and improvement in efficiency and yield potential, achieved by using multiple (preferably a large array 802 of) miniature electrostatically-controlled charged particle beam columns 206, together with corresponding local gas and photon injectors and detectors 102, 104, 106, 108, to perform material subtraction.

Figure 4A:
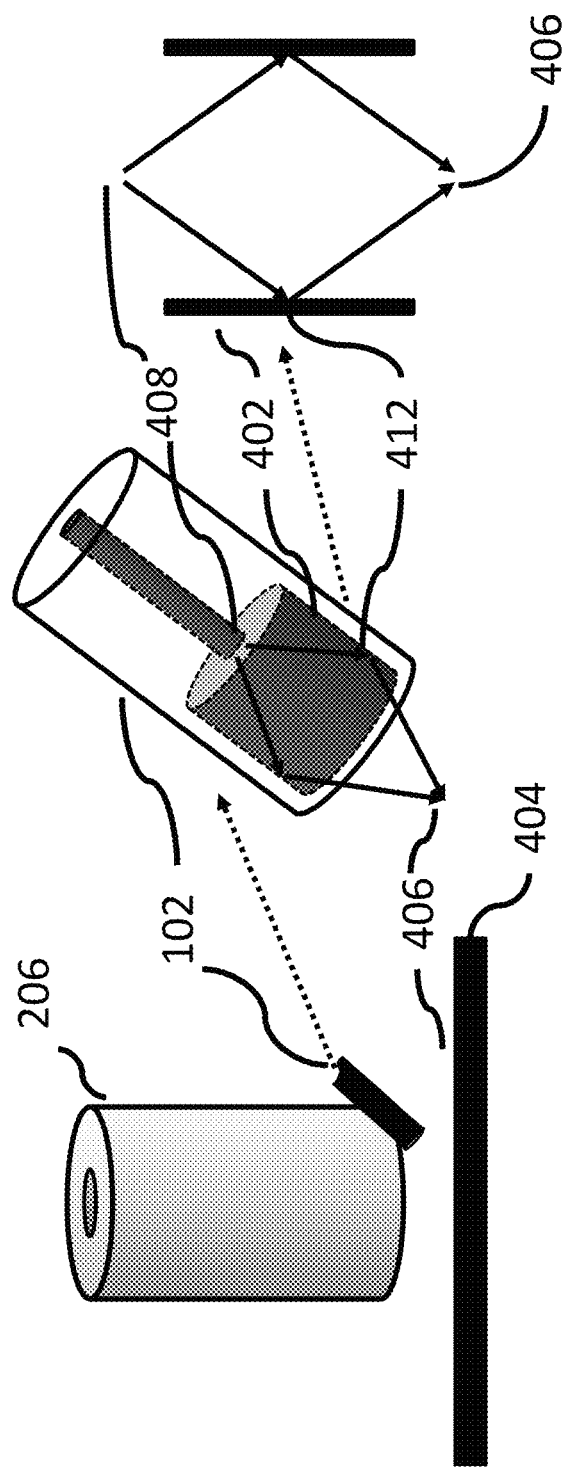
FIG. 4A schematically shows an example of a local gas injector mounted on a charged particle beam column.

FIG. 4A schematically shows an example of a local gas injector 102 mounted on a charged particle beam column 206. The gas injector preferably 102 includes a kinetic lens 402, comprising a smooth rigid body (preferably made of metal), to increase the partial pressure of gas at the focal point of the kinetic lens 402 on the substrate 404 surface 406 by focusing or collimating the gas particle flow from the gas injector outflow opening 408. Various designs of kinetic lens 402 are possible; the example shown in FIG. 4A is a cylindrical kinetic lens 402.

The gas injector 102 is connected to one or more gas sources, comprising the gas(ses) to be injected by the gas injector 102 to create or assist in creating a desired chemical environment at the main-field deflection area 410 on the surface of the substrate 406. Multiple gas injectors 102, injecting the same or different gasses, can be used.

Preferably, in reactive material subtraction embodiments (e.g., reactive ion milling and etching, and electron beam-assisted etching), one or more local gas injectors 102 is used per column 206 configured for reactive material subtraction. Local gas injectors 102 are preferably mounted on or near the bottom of corresponding columns 206, as close to corresponding main-field deflection areas 410 as possible. (A main-field deflection area 410 is generally in a fixed position relative to the corresponding column 206, and moves across the substrate's surface 406 as the stage moves).

Gas flow from a local gas injector 102 is preferably limited to the molecular flow regime (not viscous flow) to enable proper function of a kinetic lens 402 connected to the gas injector outflow opening 408. (If the gas flow is in a viscous flow regime, the kinetic lens 402 will generally not function as a lens.) In the molecular flow regime ("molecular flow"), the mean free path for gas particles (atoms or molecules of the gas) is large compared to a characteristic dimension of the local gas injector 102 or detector 106 (e.g., the path taken by gas particles between the substrate surface 406 and the gas outflow or inflow opening 408, 414). This makes it much more likely that gas particles will collide 412 with the side of the lens 402, or (for a gas injector 102) the substrate surface 406, or (for a gas detector 106) enter the gas inflow opening 408, before hitting another gas particle.

A "kinetic lens" 402 is an arrangement of one or more smooth and rigid, flat and/or curved surfaces configured to reflect gas particles, fixed in position with respect to a corresponding gas injector outflow opening 408 or gas detector inflow opening 414; such that (for a gas injector) gas particles originating at a gas injector outflow opening which intersect 412 with the kinetic lens 402 are collimated or redirected (e.g., focused) towards the corresponding main-field deflection area 410; and such that (for a gas detector 106) gas particles originating at the beam impact location (or the main-field deflection area 410) which intersect 412 with the kinetic lens 402 are redirected (e.g., focused) towards the gas detector inflow opening 414. (Generally, surfaces of a kinetic lens 402 can be thought of as similar to optical mirrors, but for gas particles.) Various designs of kinetic lens 402 can be used (see, for example, FIGS. 4A, 4B, 4C, 4D and 4E).

Preferably, kinetic lens 402 surfaces are arranged so that they do not prevent particles (atoms or molecules) of outflow gas within the kinetic lens 402 from reaching the substrate surface 404; and do not prevent particles of inflow gas within the kinetic lens 402, originating from the main-field deflection area 410 of the corresponding column 206, from reaching the inflow opening 414.

A kinetic lens 402 can be used to improve localization to the main-field deflection area 410 of increased partial pressure of an injected gas. A kinetic lens 402 can also be used to increase specificity and collection rate for a gas detector 106. "Specificity", as used herein, refers to the selectiveness of a gas detector 106 corresponding to a column 206 for material that originated within a corresponding frame 410 and not from, e.g., the frame 410 of another column 206.

Figure 4B:
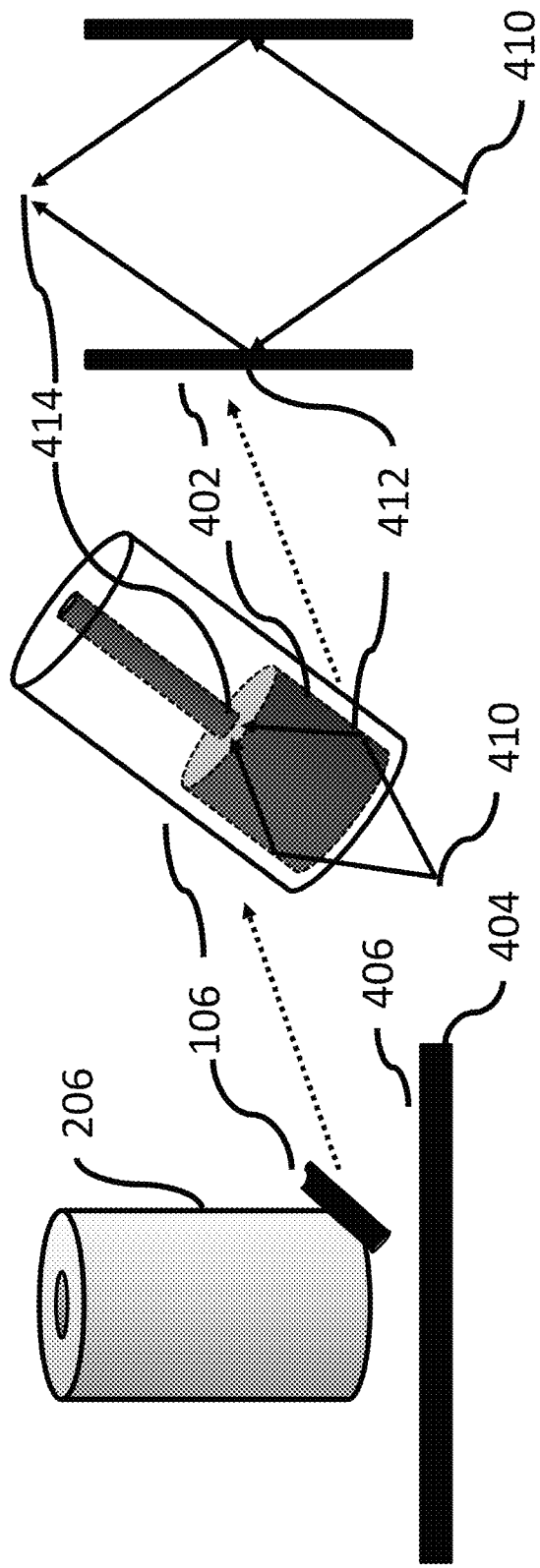
FIG. 4B schematically shows an example of a local gas detector mounted on a charged particle beam column.

FIG. 4B schematically shows an example of a local gas detector 106 mounted on a charged particle beam column 206. Preferably, a local gas detector 106 comprises a gas inflow opening 414 connected to a kinetic lens 402 configured to redirect gas particles intersecting 412 the kinetic lens 402 into the gas inflow opening 414. The gas inflow opening 414 is connected to a secondary ion mass spectrometer configured to analyze incoming gas particles and perform process monitoring and provide control feedback using said analysis.

Figure 4C:
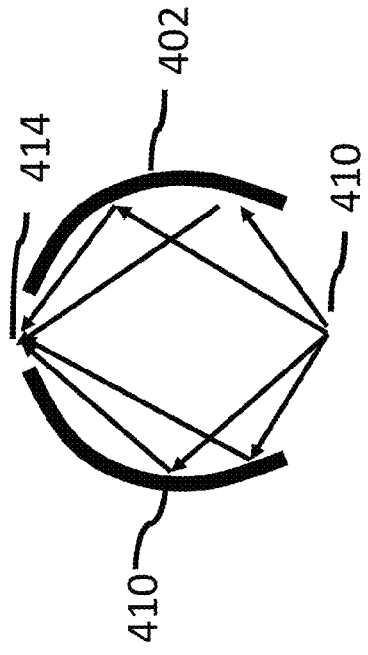
FIG. 4C schematically shows an example of a gas injector with a rotational ellipsoid kinetic lens.

FIG. 4C schematically shows an example of a gas injector 102 with a rotational ellipsoid kinetic lens 402.

Figure 4D:
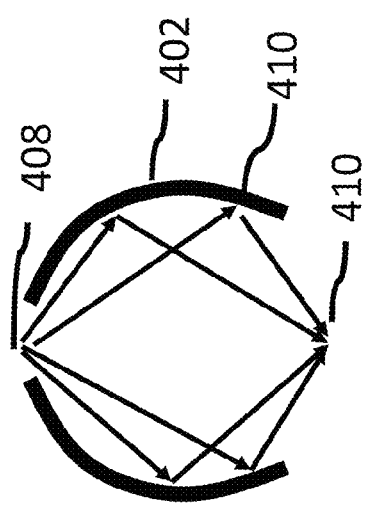
FIG. 4D schematically shows an example of a gas injector with a rotational ellipsoid kinetic lens.

FIG. 4D schematically shows an example of a gas detector 106 with a rotational ellipsoid kinetic lens 402.

A kinetic lens 402 is preferably shaped as a (truncated) rotational ellipsoid (an ellipsoidal reflector, with two equal minor axes and a longer major axis). Advantageously, gas particles which originate at one major axis focus and which intersect the kinetic lens 402 surface are reflected towards and converge at the other major axis focus. Preferably, one major axis focus of the rotational ellipsoid is located at the main-field deflection area 410 on the substrate surface, and the other major axis focus is located at the gas outflow or inflow opening 408, 414 (which can be modeled as a point source or point sink, respectively, for this purpose).

Preferred embodiments using gas injectors 102 use rotational ellipsoid kinetic lenses 402 configured such that gas particles originating at the gas injector outflow opening 408 that intersect 412 the kinetic lens surface 402 are reflected towards the main-field deflection area 410, increasing partial pressure of the gas in the frame 410.

Preferred embodiments using gas detectors 106 use rotational ellipsoid kinetic lenses 402 configured such that gas particles originating in the main-field deflection area 410 are reflected towards the gas detector inflow opening 414, significantly improving gas detector 106 collection efficiency and specificity (thus improving, e.g., sensitivity and signal to noise ratio of gas spectrometer measurement and analysis).

Figure 4E:
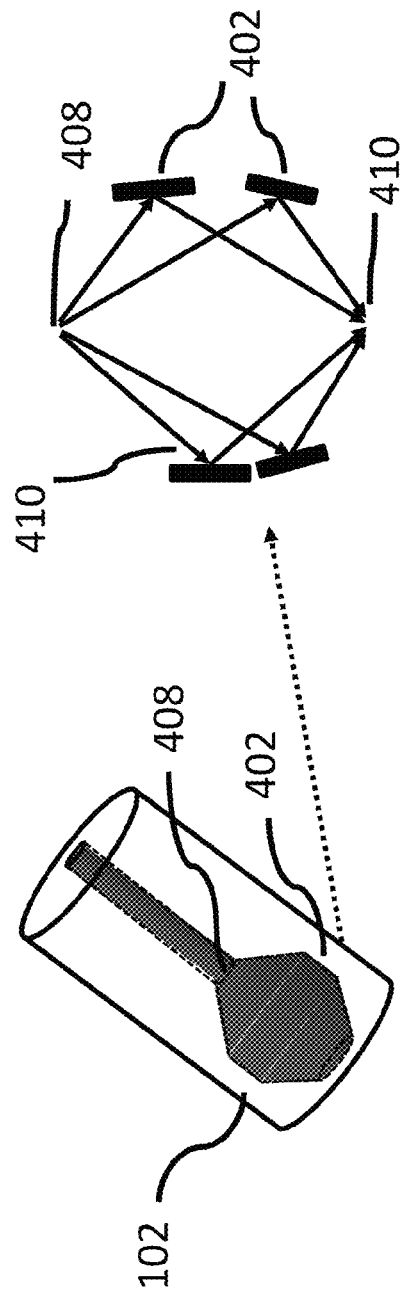
FIG. 4E schematically shows an example of a gas injector with a kinetic lens.

FIG. 4E shows an example of a gas injector 102 or gas detector 106 with a kinetic lens 402. Approximations of a rotational ellipsoid can be made using flat and/or curved surfaces configured to reflect (at least some trajectories of) gas particles originating at one (approximate) focus towards the other (approximate) focus.

FIG. 5 schematically shows an example of a photon injector 104 and a photon detector 108 mounted on a charged particle beam column 206. Preferably, a photon injector 104 comprises a light source optically connected by an optical fiber to a (cylindrical) rod lens focused on the main-field deflection area 410; and a photon detector 108 comprises a light sensor optically connected by an optical fiber to a rod lens focused on the main-field deflection area 410.

Photon injectors 104 and photon detectors 108 can be used as discussed with respect to FIG. 1 above. Further, as shown in FIG. 5, a photon injector 104 and photon detector 108 pair can be arranged so that photons emitted by a photon injector 104 are reflected off the substrate 404 and collected by the paired photon detector 108. The photon injector 104 used for this purpose can be used specifically to provide photons for the photon detector 108 to perform, e.g., polarimetry, reflectometry, interferometry or optical emission spectroscopy. Alternatively, the photon injector 104 may be dual-purpose, e.g., the detected photons may be IR photons emitted by the photon injector 104 for temperature control, or photons emitted to excite substrate surface material electrons to facilitate a desired substrate surface chemistry.

Injected photons can also be pulsed, e.g., to enable local temperature measurement, or optical emission spectroscopy of photons emitted by substrate surface material, in between pulses.

A cooled substrate stage 804 (e.g., indirectly cooling the substrate by cooling the substrate stage 804 through the chuck) can also be used to increase the adsorption rate of reactant gases on the substrate 404, and/or to keep the average temperature of the substrate approximately constant. The average temperature of the substrate 404 can be monitored and controlled by a substrate temperature control 502.

FIG. 6 schematically shows an example of a voltage bias 602 applied between a charged particle beam column 206 and a substrate 404 to create highly localized control of charged particle impact over a wide range of energies.

Substrate stage electrical bias 602 can be used, along with control of beam energy at each column 206, to optimize the efficiency of charged-particle induced chemistry and/or physical effects. Preferably, beam energy is constant (or changes slowly and/or rarely). In reactive embodiments, as the desired substrate surface chemistry changes (which can include, for example, a gas injector output changing), the electrical bias 602 of the substrate stage can be changed so that the total landing energy of an individual charged particle beam 204 (including energy contributed by the substrate stage electrical bias) is (or is significantly closer to) the landing energy that will optimize the rate and/or efficiency of the desired reaction(s).

Figure 7A:
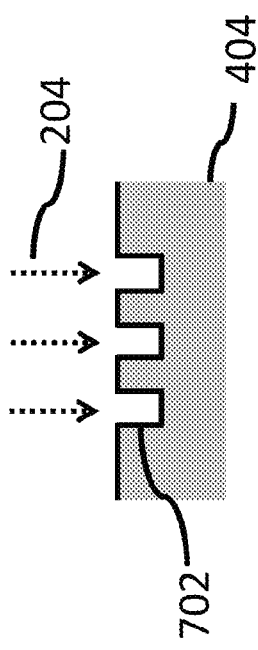
FIG. 7A schematically shows an example of the results of uniform-depth material subtraction.

FIG. 7A schematically shows an example of the results of uniform-depth material subtraction, including uniform-depth features 702.

Figure 7B:
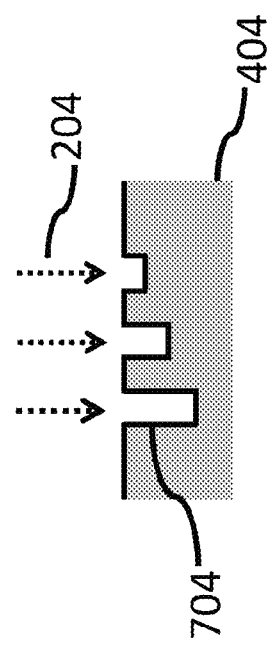
FIG. 7B schematically shows an example of the results of differentiated-depth material subtraction.

FIG. 7B schematically shows an example of the results of differentiated-depth material subtraction, including differentiated-depth features 704. Columns 206 can be configured independently to process material simultaneously but differently; e.g., to write different patterns to different depths at different rates using different beam parameters. Since columns 206 are controlled independently, they can be used to create local variations in pattern depth (e.g., 3-D topography). Differentiated-depth material subtraction, which can create 3-D structures, can be achieved by varying, for example, exposure time, dose, local reactant partial pressure, or local reactant chemistry beneath a charged particle beam column 206 as the targeted beam position is moved.

Figure 8:
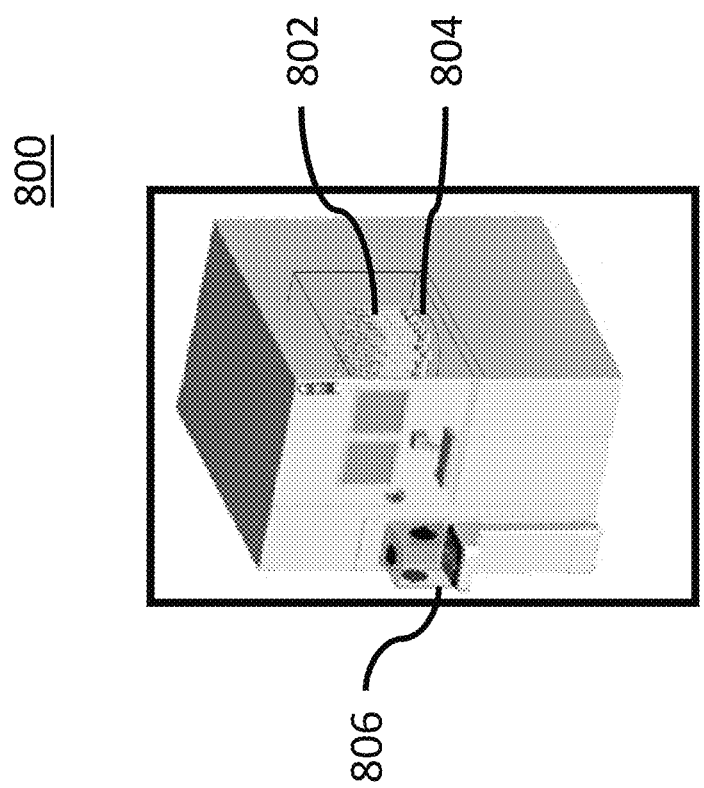
FIG. 8 schematically shows an example of a multiple column charged particle beam system FIG. 9 schematically shows an example of a charged particle beam cluster tool.

FIG. 8 schematically shows an example of a multiple column charged particle beam system 800. An appropriately configured multi-column charged particle beam system 800 can be used for highly localized material subtraction using, for example, reactive or non-reactive ion milling, electron-assisted etching, or electron beam milling. The system shown in FIG. 8 includes an array 802 of miniature charged particle beam columns 206, a thermally controlled wafer stage 804, a wafer loading and unloading mechanism 806, control electronics, a vacuum system, an alignment system, vibration isolation and magnetic shielding. Depending on (for example) the particular material subtraction application intended, a multi-column charged particle beam system 800 preferably also includes one or more of local gas injectors 102, local photon injectors 104, local gas detectors 106 and local photon detectors 108.

Figure 9:
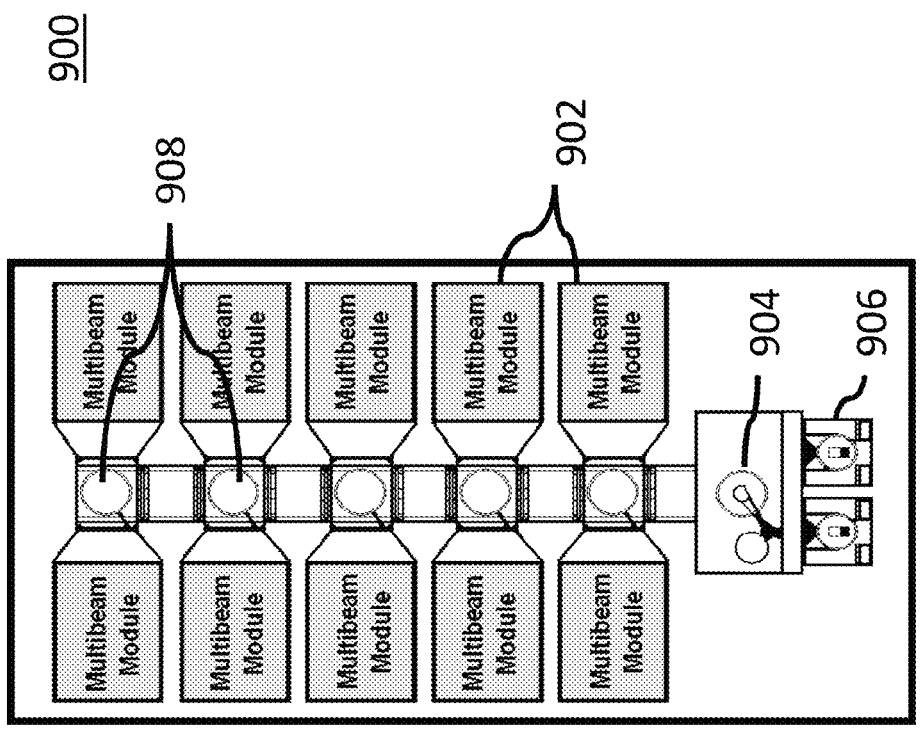

FIG. 9 schematically shows an example of a charged particle beam cluster tool 900. A charged particle beam cluster tool 900 comprises multiple charged particle beam modules 902. An individual charged particle beam module 902 comprises an array 802 of charged particle beam columns 206 in ultra high vacuum, as well as a wafer stage 804 and alignment mechanism. Individual modules 902, and/or individual columns 206 within a module 902, can be configured to specialize in a particular type of charged particle beam substrate processing. For example, one module 902 can be configured for material subtraction using non-reactive ion milling, while a second module 902 is configured for material subtraction using reactive ion etching. In another example, some columns 206 in a module 902 can be configured to perform electron beam-assisted etching, while other columns 206 in that module 902 are configured and optimized for substrate inspection using electron beam imaging.

In addition to process modules 902, a cluster tool 900 generally also comprises a substrate handling system 904, a substrate loading/unloading system 906 and a factory interface. Within a cluster tool 900, a wafer transport system 908 delivers wafers to one or more—in some embodiments, all (e.g., sequentially)—of the tool's process modules 902, and can also perform in-vacuum pre-alignment. Other sub-systems necessary for charged particle beam control, gas injection, and substrate processing are not depicted (e.g. control electronics, vacuum systems, alignment systems, vibration isolation, magnetic shielding and gas injection flow control and measurement).

Figure 10:
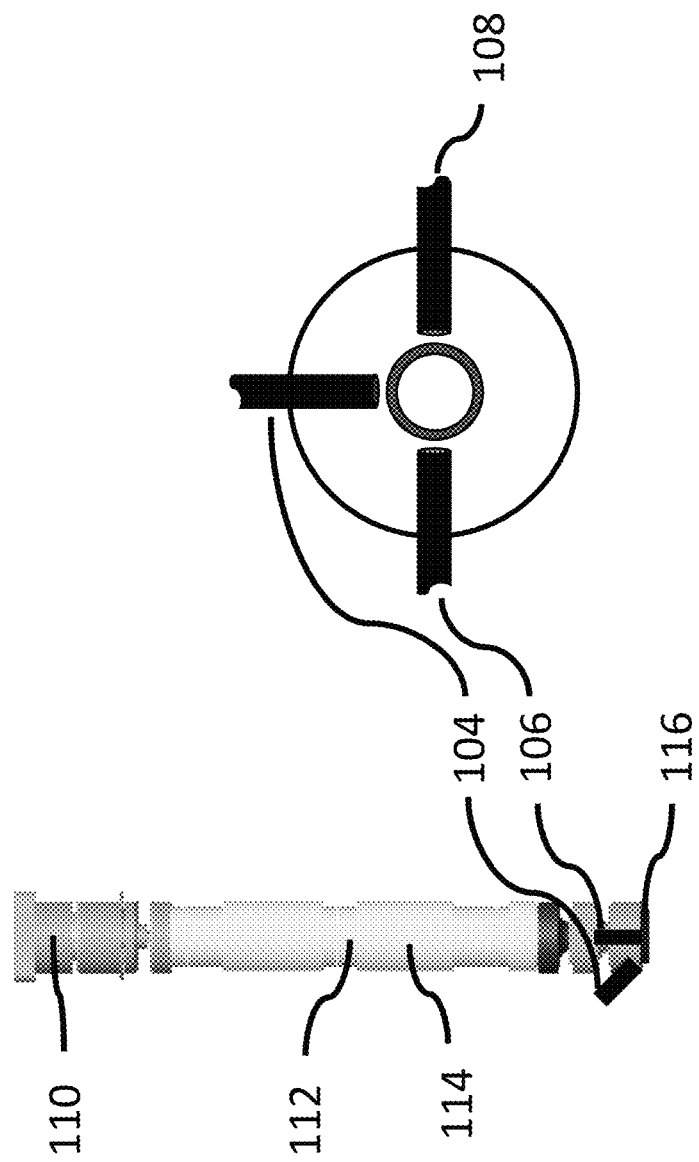
FIG. 10 schematically shows an example of a charged particle beam column.

FIG. 10 schematically shows an example of a charged particle beam column 206 configured for non-reactive charged particle beam material subtraction. In some embodiments of non-reactive charged particle beam material subtraction that do not use local gas injectors the column 206 comprises: a charged particle beam gun 110 (an ion gun or electron beam gun), including a charged particle source (an ion or electron source, respectively), aperture and electrostatic lens; a deflection assembly 112 for blanking the charged particle beam 204, deflecting the charged particle beam trajectory, and/or modifying the charged particle beam shape (blanking, deflecting or reshaping the ion or electron beam 204, respectively); a main lens 114, for focusing the charged particle beam 204 (ion or electron beam) or adjusting the beam size at the substrate plane; one or more local photon injectors 104; a local gas detector 106; one or more photon detectors 108; and an electron detector 116.

As will be understood by one of ordinary skill in the arts of charged particle beam material removal, focus areas described in this application of gas and photon injectors and detectors 102, 104, 106, 108 (typically, the main-field deflection area 410) are approximate; that is, they comprise the described area, within (plus or minus) the range or error allowed by the particular process (and/or application) performed by the corresponding column 206, such that the desired function, effect and/or accuracy of that process (and/or application) are preserved.

According to some but not necessarily all embodiments, there is provided: A method for targeted removal of substrate material using multiple charged particle beam columns, individual columns projecting individual charged particle beams at the substrate, comprising the actions of: removing substrate surface material using the beams, columns corresponding to the beams targeting different corresponding locations in different frames on the substrate, said removing immediately subsequent to said material receiving direct affect by said beams; and injecting at least one gas, using local gas injectors, onto multiple ones of said frames, wherein said gas is selected to enable, and/or to improve the rate and/or efficiency, of said removing, and wherein said removing and said injecting are performed differently and simultaneously by different ones of said columns and said local gas injectors.

According to some but not necessarily all embodiments, there is provided: A method for targeted removal of substrate material using multiple charged particle beam columns, individual columns projecting individual charged particle beams at the substrate, comprising the actions of: removing substrate surface material using the beams, columns corresponding to the beams targeting corresponding different locations on the substrate, said removing immediately subsequent to said material receiving direct affect by said beams; collecting, using local gas detectors, material volatilized or scattered from frames corresponding to said local gas detectors; analyzing said collected material; and automatically modifying parameters controlling said removing in at least partial dependence on said analyzing, wherein said removing is performed differently and simultaneously by different ones of said columns.

According to some but not necessarily all embodiments, there is provided: A method for targeted removal of substrate material using multiple charged particle beam columns, individual columns projecting individual charged particle beams at the substrate, comprising the actions of: removing substrate surface material using the beams, columns corresponding to the beams targeting different corresponding locations in different frames on the substrate, said removing immediately subsequent to said material receiving direct affect by said beams; and injecting photons onto multiple ones of said frames using local photon injectors, said photons having a wavelength selected to, within corresponding ones of said frames, do at least one of: raising the temperature of the substrate surface material, exciting electrons of said substrate surface material, and reflecting photons off said corresponding frame to be collected by a local photon detector, wherein said removing and said injecting are performed differently and simultaneously by different ones of said columns and said local photon injectors.

According to some but not necessarily all embodiments, there is provided: A method for targeted removal of substrate material using multiple charged particle beam columns, individual columns projecting individual charged particle beams at the substrate, comprising the actions of: removing substrate surface material using the beams, columns corresponding to the beams targeting different corresponding locations in different frames on the substrate, said removing immediately subsequent to said material receiving direct affect by said beams; and collecting photons emitted or reflected from said frames using local photon detectors, analyzing said collected photons, and at least one of: determining endpoints for said removing in at least partial dependence on said analyzing, wherein said removing is performed in at least partial dependence on said determining; and automatically modifying parameters controlling said removing in at least partial dependence on said analyzing; wherein said removing is performed differently and simultaneously by different ones of said columns.

According to some but not necessarily all embodiments, there is provided: A multibeam tool for manufacturing substrate devices, comprising: multiple electrostatically-deflected charged particle beam columns, individual ones of said columns configured to project an individual charged particle beam at the substrate; multiple LOCAL gas injectors, at least one LOCAL gas injector corresponding to each of said columns.

According to some but not necessarily all embodiments, there is provided: A multibeam tool for manufacturing substrate devices, comprising: multiple electrostatically-deflected charged particle beam columns, individual ones of said columns configured to project an individual charged particle beam at the substrate; multiple LOCAL gas detectors, at least one LOCAL gas detector corresponding to each of said columns.

According to some but not necessarily all embodiments, there is provided: A multibeam tool for manufacturing substrate devices, comprising: multiple electrostatically-deflected charged particle beam columns, individual ones of said columns configured to project an individual charged particle beam at the substrate; multiple LOCAL photon injectors, at least one LOCAL photon injector corresponding to each of said columns.

According to some but not necessarily all embodiments, there is provided: A multibeam tool for manufacturing substrate devices, comprising: multiple electrostatically-deflected charged particle beam columns, individual ones of said columns configured to project an individual charged particle beam at the substrate; multiple LOCAL photon detectors, at least one LOCAL photon detector corresponding to each of said columns.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In some embodiments, multibeam tools comprising electrostatically-deflected charged particle beam columns using local gas and/or photon injectors and/or detectors can also be used to perform other substrate manufacturing processes, particularly: addition of materials to a substrate surface as designated by a design layout database and localized to substrate positions directly affected by said beams (material addition); and modification of physical and chemical properties, structure and composition of substrate surface material as designated by a design layout database and localized to substrate surface material directly affected by said beams (material modification).

Though particular types of material subtraction process have been described hereinabove, other material subtraction processes, such as electron-induced dissociation and electron beam milling, can also be used.

In some embodiments, particularly at high beam energies, an ion beam used for substrate material etching can also perform significant substrate material milling.

In some embodiments, ion beam columns can be matched to electron beam columns by calibrating deflection parameters (and/or other column parameters) to take into account beam composition (and other column configuration) differences.

In some embodiments, ion beam columns are matched to ion beam columns, and electron beam columns are matched to electron beam columns, but ion beam columns are not matched to electron beam columns.

In some embodiments, patterns can be designed to increase the average number of features per frame that contains features, and/or to increase the number of frames that contain no features; e.g., to take advantage of per-frame localization of endpoint detection and process monitoring, and/or to improve signal-to-noise ratio of process measurements and analysis.

In some embodiments, a column (i.e., with particular injectors and/or detectors) can be used to perform more than one material subtraction process type or other substrate process (e.g., imaging for purposes of defect detection) without changing the column's physical configuration.

In some embodiments, a physical configuration of a column can be specialized and/or optimized to perform a single material subtraction process type or other substrate process (e.g., imaging for purposes of defect detection).

In some embodiments, the body of an injector or detector interpenetrates the housing of a column (without interfering with charged particle beam path-related structures, or the beam itself).

In some embodiments, in which there is a mechanical impediment preventing making an injector or detector local, the injector or detector is located outside the perimeter of the corresponding column but within the writing area of the column.

In some embodiments, a local injector or detector is located between the column and the substrate surface.

In some embodiments (e.g., for some material subtraction processes and/or applications and/or other substrate manufacturing processes), there is a linear proportionality between gas partial pressure increase within the main-field deflection area and material subtraction rate (e.g., when gas partial pressure is the rate-limiting parameter).

In some embodiments, one or more columns perform material subtraction (etch and/or mill) on multiple layers in a single pass—e.g., within a single process cycle, on multiple layers in one or more frames (separate main-field deflection areas). In some such embodiments, different material subtraction process types (e.g., reactive vs. nonreactive etch, or etch vs. mill) are used to perform material subtraction on different ones of said multiple layers in a particular frame.

In some embodiments, material subtraction is used to perform single-atomic-layer etch. In some such embodiments, gas injection and charged particle beam scanning of the substrate material are performed in sequence; for example, gas can be injected until it is sufficiently adsorbed by the substrate surface, and then reactive ion etching can be used to remove a single atomic layer from the substrate surface.

In some embodiments, local gas and/or photon detectors can be used to generate persistent per-column performance metrics.

In some embodiments, gas and/or photon injection can be performed prior to charged particle beam scanning, e.g., to prepare the substrate surface in advance.

Though particular combinations of local gas and photon injectors, and local gas, photon and electron detectors have been described herein, one of ordinary skill in the arts of material removal using charged particle beams will understand that various other combinations, including some or all of said local injectors and detectors, with one or more of ones of said injectors and detectors local per column, can be used to configure a column and to perform material subtraction as disclosed herein.

In some embodiments, local detectors (local and corresponding to one or more columns) can be limited to local electron detectors used for overlay (accurate placement of a pattern layer over one or more prior pattern layers), local photon detectors used for localized temperature monitoring, and local gas detectors used for localized process monitoring.

In some embodiments, local detectors can be limited to local electron detectors used for overlay, localized process monitoring and end point detection.

In some embodiments, local detectors can be limited to local photon detectors used for localized process monitoring and end point detection, e.g., in applications where overlay is not required, such as single-layer photomask patterning.

In some embodiments, local gas injectors are used to induce favorable chemical environments at the substrate surface for non-reactive charged particle beam etching and milling.

In some embodiments, a local gas injector focuses gas particles on an area larger than the main-field deflection area; in some embodiments, a local photon injector does so for advance preparation of adjacent frames.

In some non-reactive material subtraction embodiments, e.g., ion milling, local gas injectors (configured, for example, as disclosed herein with respect to FIG. 4A) are used to inject gasses that increase the efficiency and/or rate of said non-reactive material subtraction.

In some embodiments, local gas detectors can be used for endpoint detection.

In some embodiments, a local gas detector can be used to perform analysis of gas particles with techniques other than secondary ion mass spectrometry.

In some embodiments, a kinetic lens is atomically smooth.

In some embodiments, the largest diameter of a kinetic lens is significantly larger than the diameter of the corresponding gas outflow or inflow opening.

In some embodiments, a kinetic lens is fixedly connected to a gas injector outflow or a gas detector inflow so that gas particles cannot escape from the connection between the kinetic lens and the corresponding gas outflow or inflow opening.

In some embodiments, a kinetic lens is wholly or partially nonmetallic.

In some embodiments, a kinetic lens is shaped such that few or no possible gas particle trajectories originating at an intended gas particle source (generally, the main-field deflection area or a corresponding gas injector opening) will result in a gas particle being "trapped" within the kinetic lens. In some embodiments, a kinetic lens is shaped such that few or no possible gas particle trajectories originating at an intended gas particle source will be reflected by the kinetic lens such that the gas particle moves closer to said source and further from the intended destination (generally, a corresponding gas detector opening or the main-field deflection area).

In some embodiments, a frame-facing kinetic lens opening is smaller than the largest diameter (orthogonal to the main axis) of the kinetic lens.

While particular examples of kinetic lens shapes have been described hereinabove, it will be apparent to one of ordinary skill in the arts of charged particle beam substrate material removal that other kinetic lens shapes can also be used to stochastically increase partial pressure in the main-field deflection area (e.g., through gas flow collimation and focusing). For example, ellipsoids with three different axes, paraboloidal reflectors, or elongated truncated tapering flat-sided or curved-sided horns.

In some embodiments, photon injectors and/or photon detectors can be fixed in position with respect to a corresponding individual column and disposed non-locally to that corresponding column, as long as they are able to focus sufficient emitted photons on, or collect sufficient emitted photons from, the main-field deflection area of said corresponding column (or larger area within the corresponding writing area) to effectively function as disclosed herein for the particular material subtraction process(es) in which they are used.

In some embodiments, one or more lasers, e.g., diode lasers, provide the light source for a local photon injector.

In some embodiments, wavelength and/or wavelength range and/or distribution of photons emitted by a photon injector is tunable.

In some embodiments, non-local photon injectors are used, ones of said photon injectors fixed in position with respect to corresponding columns and having line of sight on a desired irradiation area within the corresponding writing area.

In some embodiments, non-local photon detectors are used, ones of said photon detectors fixed in position with respect to corresponding individual ones of the columns and having line of sight on a desired photon collection area within the corresponding writing area.

In some embodiments, a local photon injector focuses emitted photons on an area within the main-field deflection area.

In some embodiments, a local photon injector focuses emitted photons on an area larger than the main-field deflection area; in some embodiments, a local photon injector does so for advance preparation of adjacent frames.

In some embodiments, a local photon detector is arranged to collect reflected IR photons to perform process monitoring, where said IR photons were also used to increase the temperature of the substrate.

In some embodiments, other or additional analyses are performed on collected photons than those listed hereinabove.

In some embodiments, other or additional properties of substrate surface material are determined using analysis of detected photons than those listed hereinabove.

In some embodiments, photon injectors shine photons with one or more wavelengths between infrared and deep UV on the main-field deflection area.

In some embodiments, one or more local photon injectors are not paired with corresponding photon detectors, such that reflected light from the unpaired photon injectors will generally not be detected. In some embodiments, one or more local photon detectors are not paired with corresponding photon injectors, such that the unpaired photon detectors will primarily detect emitted (from the substrate surface), rather than reflected light.

A person of ordinary skill in the arts of charged particle beam substrate material removal will recognize that a variety of optical lens materials and shapes, and optical connections between light sources and optical lenses, can be used for photon injectors and detectors; and that a variety of light sources can be used for photon injectors.

In some photon injector embodiments, a light source and an optical lens are directly connected. In some photon detector embodiments, an optical lens and a sensor are directly connected. One of ordinary skill in the arts of charged particle beam material removal will understand that various types of connection between light source and optical lens, between sensor and optical lens, between gas injector outflow and gas source, and between gas detector inflow and mass spectrometer can be used.

In some embodiments, such as when a "shadowing" effect is anticipated such that one or more photon injectors will not have line-of-sight on a target beam impact location during (at least one period of) a material subtraction process (generally, as a result of particular 3-D geometry being formed), two to four photon injectors (spaced at, e.g., 90 or 180 degree increments) can be used so that when a photon injector is "shadowed", one or more of the other photon injectors will have line of sight on the target beam impact location.

In some embodiments, material subtraction as disclosed herein can be used in combination with other substrate processing procedures (e.g., optical lithography and/or charged particle beam lithography) that use resist and/or photomasks to produce semiconductor and other substrate devices.

Additional general background, which helps to show variations and implementations, may be found in the following publications, all of which are hereby incorporated by reference: Cornelius Thiele, et al., "Electron-beam-induced direct etching of graphene", Carbon, vol. 64, 84 (2013); Ivo Utke, et al., "Gas-assisted focused electron beam and ion beam processing and fabrication", J. Vac. Sci. Technol. B 26, 1197 (2008); P. Roediger, et al., "Focused electron beam induced etching of silicon using chlorine", Nanotechnology 21 285306 (2010); H. Henry Yue, et al., "Plasma etching endpoint detection using multiple wavelengths for small open-area wafers", J. Vac. Sci. Technol. A 19, 66 (2001); U.S. Pat. No. 6,355,994; U.S. Pat. No. 6,617,587; U.S. Pat. No. 6,734,428; U.S. Pat. No. 6,738,506; U.S. Pat. No. 6,777,675; U.S. Pat. No. 6,844,550; U.S. Pat. No. 6,872,958; U.S. Pat. No. 6,943,351; U.S. Pat. No. 6,977,375; U.S. Pat. No. 7,122,795; U.S. Pat. No. 7,227,142; U.S. Pat. No. 7,435,956; U.S. Pat. No. 7,456,402; U.S. Pat. No. 7,462,848; U.S. Pat. No. 7,786,454; U.S. Pat. No. 7,928,404; U.S. Pat. No. 7,941,237; U.S. Pat. No. 8,242,457; U.S. Pat. No. 8,384,048; U.S. Pat. No. 8,999,627; and U.S. Pat. No. 8,999,628.

Additional general background, which helps to show variations and implementations, as well as some features which can be implemented synergistically with the inventions claimed below, may be found in the following US patent applications. All of these applications have at least some common ownership, copendency, and inventorship with the present application, and all of them, as well as any material directly or indirectly incorporated within them, are hereby incorporated by reference: U.S. patent application Ser. No. 14/085,768; U.S. patent application Ser. No. 14/522,563; and U.S. patent application Ser. No. 14/607,799.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method for targeted removal of substrate material using multiple charged particle beam columns, individual columns projecting individual charged particle beams at the substrate, comprising the actions of:
   removing substrate surface material using the beams, columns corresponding to the beams targeting different corresponding locations in different frames on the substrate, said removing immediately subsequent to said material receiving direct affect by said beams; and
   injecting photons onto multiple ones of said frames using photon injectors, said photons having a wavelength selected to, within corresponding ones of said frames, do at least one of:
     raising the temperature of the substrate surface material to facilitate said removing,
     exciting electrons of said substrate surface material to facilitate said removing, and
     reflecting photons off said corresponding frame to be collected by a local photon detector,
   wherein said removing and said injecting are performed differently and simultaneously by different ones of said columns and said photon injectors.

2. The method of claim 1, wherein different columns target different writing areas, and wherein said photon injectors are local photon injectors.

3. The method of claim 1, wherein said injecting by a one of said photon injectors local to one of the columns does not increase photon incidence within frames of other columns more than 10% with respect to average photon incidence on the substrate within the corresponding writing areas, not including photon injectors corresponding to said other frames.

4. The method of claim 1, wherein said column targeting and said injecting are performed in at least partial dependence on the design layout database of the substrate.

5. The method of claim 1, wherein ones of the beams are either ion beams or electron beams, and said removing comprises at least one of reactive ion etching, ion milling, electron-assisted etching and electron-induced dissociation.

6. The method of claim 1, wherein different wavelength photons are injected onto at least some different frames and/or different ones of said photon injectors inject different wavelength photons.

7. The method of claim 1, wherein said raising the temperature comprises injecting infrared photons, and wherein said raising the temperature heats said corresponding frame to a selected temperature.

8. The method of claim 7, further comprising cooling the substrate to an average temperature at or below a lowest one of said selected temperatures.

9. The method of claim 7, wherein said temperature is selected to adjust an adsorption rate of said substrate surface material.

10. The method of claim 1, further comprising collecting photons emitted or reflected from said frames using photon detectors; analyzing said collected photons; and at least one of:
   determining endpoints for said removing in at least partial dependence on said analyzing, wherein said removing and/or said injecting are performed in at least partial dependence on said determining; and
   automatically modifying parameters controlling said removing and/or said injecting in at least partial dependence on said analyzing.

11. The method of claim 10, wherein said modified parameters are used to perform said removing and/or said injecting on the same substrate layer as said collecting was performed on.

12. The method of claim 10, wherein said modifying comprises changing the brightness, wavelength, pulse duration and/or pulse frequency of said injecting by corresponding ones of said photon injectors.

13. The method of claim 1, wherein said removing substrate surface material removes hard mask material, further comprising blanket depositing said hard mask on the substrate before said removing, and blanket etching different substrate material underlying said hard mask after said removing.

14. The method of claim 1, wherein neither a photomask nor a resist layer is used to remove material acted upon by said removing.

15. The method of claim 1, wherein different ones of the columns and/or of said photon injectors stop and/or restart at different times said projecting and/or said injecting, respectively, during a process cycle.

16. The method of claim 1, wherein said removing does not comprise removing hard mask material.

17. A method for targeted removal of substrate material using multiple charged particle beam columns, individual columns projecting individual charged particle beams at the substrate, comprising the actions of:
   removing substrate surface material using the beams, columns corresponding to the beams targeting different corresponding locations in different frames on the substrate, said removing immediately subsequent to said material receiving direct affect by said beams; and
   collecting photons emitted or reflected from said frames using photon detectors, analyzing said collected photons, and at least one of:
      determining endpoints for said removing in at least partial dependence on said analyzing, wherein said removing is performed in at least partial dependence on said determining; and
      automatically modifying parameters controlling said removing in at least partial dependence on said analyzing;
   wherein said removing is performed differently and simultaneously by different ones of said columns.

18. The method of claim 17, wherein said analyzing comprises one or more of polarimetry, reflectometry, interferometry and optical emission spectroscopy.

19. The method of claim 17, wherein said analyzing comprises determining a corresponding rate of said removing for corresponding ones of said frames.

20. The method of claim 17, further comprising automatically adjusting beam parameters in at least partial dependence on said analyzing and/or said determining.

21. The method of claim 17, wherein said modifying changes parameters controlling real-time endpoint determination using local electron and/or said photon detectors.

22. The method of claim 17, wherein said modified parameters are used to perform said removing on the same pattern layer as said collecting was performed on.

23. The method of claim 17, wherein different columns target different writing areas.

24. The method of claim 17, wherein said column targeting and said determining are performed in at least partial dependence on the design layout database of the substrate.

25. The method of claim 17, wherein ones of the beams are either ion beams or electron beams, and said removing comprises at least one of reactive ion etching, ion milling, electron-assisted etching and electron-induced dissociation.

26. The method of claim 17, wherein said removing substrate surface material removes hard mask material, further comprising blanket depositing said hard mask on the substrate before said removing, and blanket etching different substrate material underlying said hard mask after said removing.

27. The method of claim 17, wherein neither a photomask nor a resist layer is used to remove material acted upon by said removing.

28. The method of claim 17, wherein said removing does not comprise removing hard mask material.

\* \* \* \* \*